United States Patent
Dechene et al.

(10) Patent No.: US 11,158,536 B2
(45) Date of Patent: Oct. 26, 2021

(54) PATTERNING LINE CUTS BEFORE LINE PATTERNING USING SACRIFICIAL FILL MATERIAL

(71) Applicant: International Business Machines Corporation, Armonk, NY (US)

(72) Inventors: Daniel James Dechene, Watervliet, NY (US); Timothy Mathew Philip, Albany, NY (US); Somnath Ghosh, Clifton Park, NY (US); Robert Robison, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 16/736,478

(22) Filed: Jan. 7, 2020

(65) Prior Publication Data
US 2021/0210379 A1    Jul. 8, 2021

(51) Int. Cl.
*H01L 21/033* (2006.01)
*H01L 21/768* (2006.01)
*H01L 21/311* (2006.01)

(52) U.S. Cl.
CPC .... *H01L 21/76816* (2013.01); *H01L 21/0332* (2013.01); *H01L 21/0337* (2013.01); *H01L 21/31144* (2013.01); *H01L 21/31111* (2013.01)

(58) Field of Classification Search
CPC ............. H01L 21/0332; H01L 21/0337; H01L 21/31144; H01L 21/76816
See application file for complete search history.

(56) References Cited

U.S. PATENT DOCUMENTS

| | | |
|---|---|---|
| 9,263,325 B1 | 2/2016 | Wei et al. |
| 9,607,886 B1 | 3/2017 | Burns et al. |
| 9,679,809 B1 | 6/2017 | Kye et al. |
| 9,704,859 B1 | 7/2017 | Cheng et al. |
| 9,773,676 B2 | 9/2017 | Chang et al. |
| 9,818,641 B1 | 11/2017 | Bouche et al. |
| 9,887,135 B1 * | 2/2018 | Wallner .......... H01L 21/823456 |
| 9,991,156 B2 | 6/2018 | Burns et al. |
| 10,242,907 B2 | 3/2019 | Ryckaert et al. |
| 10,256,110 B2 | 4/2019 | Mohanty |
| 10,685,874 B1 * | 6/2020 | Xie ................... H01L 21/76832 |

(Continued)

OTHER PUBLICATIONS

A. Raley et al., "Self-Aligned Blocking Integration Demonstration for Critical Sub 40nm Pitch Mx Level Patterning," Proceedings of SPIE, Advanced Etch Technology for Nanopatterning VI, Apr. 7, 2017, 11 pages, vol. 10149.

*Primary Examiner* — Jaehwan Oh
(74) *Attorney, Agent, or Firm* — Randall Bluestone; Ryan, Mason & Lewis, LLP (57) ABSTRACT

A method includes forming a dielectric layer on a semiconductor substrate, forming a hard mask layer on the dielectric layer, forming a sacrificial mandrel layer on the hard mask layer, depositing a sacrificial fill material in an opening in the sacrificial mandrel layer and utilizing the sacrificial fill material to selectively pattern the hard mask layer. The pattern defining first and second spaced openings in the hard mask layer. The method further includes etching the dielectric layer through the first and second openings in the hard mask layer to create first and second trenches in the dielectric layer separated by a dielectric segment of the dielectric layer.

20 Claims, 8 Drawing Sheets

(56) References Cited

U.S. PATENT DOCUMENTS

| | | | |
|---|---|---|---|
| 2019/0109045 A1* | 4/2019 | Xie | H01L 23/5226 |
| 2019/0157082 A1 | 5/2019 | Fan et al. | |
| 2019/0206717 A1* | 7/2019 | Zhu | H01L 21/4857 |
| 2019/0206725 A1* | 7/2019 | Chu | H01L 21/7688 |
| 2019/0221428 A1* | 7/2019 | Burns | G03F 7/0002 |
| 2020/0312764 A1* | 10/2020 | Ning | H01L 23/5226 |

* cited by examiner

PATTERNING LINE CUTS BEFORE LINE PATTERNING USING SACRIFICIAL FILL MATERIAL

BACKGROUND

The present disclosure relates to semiconductor fabrication techniques and, in particular, relates to a backend-of-line (BEOL) methodology and structure to pattern line cuts before line patterning in a BEOL interconnect structure.

A semiconductor integrated circuit chip is typically fabricated with a BEOL interconnect structure, which comprises multiple levels of metal lines and inter-level metal vias, to connect various integrated circuit components and devices that are fabricated as part of a front-end-of-line (FEOL)/middle-of-line (MOL) layer(s) of the semiconductor integrated circuit chip. Formation of the metal lines within the BEOL interconnect structure typically includes patterning of trenches in a substrate utilizing photolithographic and etching processes. Initially, a pattern of photoresist lines is formed, which is subsequently transferred to an underlying hard mask layer. The pattern is then transferred to an underlying interlayer dielectric to establish the trenches for subsequent deposition of conductive material thereby forming the patterned metal lines in the BEOL interconnect structure. Line patterning generally requires gapping or establishing cuts in the metal lines to interrupt the metallic lines in accordance with the intended architecture of the BEOL interconnect structure. Conventional methodologies utilize blocking elements and other processes to create a gap in the lines. However, these known processes are deficient in consistently producing gaps in a uniform manner, and thus are prone to creating shorts in the circuit components and other significant degradations in yield, performance, and reliability.

SUMMARY

Embodiments of the present application provide techniques for establishing, metal cuts in a metallic interconnect of a semiconductor component.

In an illustrative embodiment, a method comprises forming a dielectric layer on a semiconductor substrate, forming a hard mask layer on the dielectric layer, forming a mandrel layer on the hard mask layer, creating an opening in the mandrel layer, depositing a sacrificial cut material within the opening of the mandrel layer, applying a photoresist material onto the mandrel layer, patterning the photoresist material to create a resist image having at least two resist openings separated by the sacrificial cut material, selectively etching segments of the mandrel layer and the hard mask layer beneath the resist openings of the photoresist to remove the segments and transfer the resist image to the hard mask layer, removing the mandrel layer and the sacrificial cut material, etching the dielectric layer utilizing the transferred resist image to create at least first and second trenches within the dielectric layer separated by a segment of the dielectric layer vertically aligned with a location of the previously removed sacrificial cut material, and depositing a metallic material within the trench openings to define at least first and second lines in the trench openings separated by the segment of the dielectric layer.

In another illustrative embodiment, a method comprises forming a dielectric layer on a semiconductor substrate, forming a hard mask layer on the dielectric layer, forming a sacrificial mandrel layer on the hard mask layer, creating a line cut in the sacrificial mandrel layer by forming an opening in the mandrel layer and filling the opening with sacrificial cut material, forming first and second open lines within the mandrel layer on opposed sides of the sacrificial cut material, removing segments of the hard mask layer and the dielectric layer vertically aligned with the first and second cuts to thereby form first and second trenches in the dielectric layer vertically aligned with the first and second open lines and separated by an aligned segment of the dielectric layer beneath a location of the sacrificial cut material, and depositing a metallic material within the first and second trenches to define at least first and second lines in the trenches separated by the aligned segment of the dielectric material.

In yet another illustrative embodiment, a method comprises forming a dielectric layer on a semiconductor substrate, forming a hard mask layer on the dielectric layer, forming a sacrificial mandrel layer on the hard mask layer, depositing a sacrificial fill material in an opening in the sacrificial mandrel layer and utilizing the sacrificial fill material to selectively pattern the hard mask layer. The pattern forms first and second spaced openings in the hard mask layer. The method further comprises etching the dielectric layer through the first and second openings in the hard mask layer to create first and second trenches in the dielectric layer separated by a dielectric segment of the dielectric layer.

These and other objects, features and advantages of the present disclosure will become apparent from the following detailed description of illustrative embodiments thereof, which is to be read in connection with the accompanying drawings.

DETAILED DESCRIPTION

In illustrative embodiments, a metal interconnect structure has one or more pairs of lines separated by a spacing or gap patterned using spacer assisted lithography and etching processes. Moreover, the techniques described herein consistently produce uniform line breaks that are applicable to current advanced small-scale BEOL manufacturing patterning techniques.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure or stack is not to be interpreted as requiring direct contact of the components for it is possible one or more intermediate components, layers or coatings may be positioned between the select components unless otherwise specified. More specifically, positional relationships, unless specified otherwise, can be direct or indirect, and the present invention is not intended to be limiting in this respect.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Back-end-of-line (BEOL) processes are generally focused on forming metal interconnects between the different devices of the integrated circuit whereas the fabrication of the different devices that make up the integrated circuit are generally formed during the front end of line (FEOL) processing.

Exemplary embodiments of the invention will now be discussed in further detail with regard to semiconductor devices and methods of manufacturing same and, in particular, to using cut fill materials for patterning of break lines of an interconnect BEOL structure.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

In accordance with an embodiment of the present invention, cut fill materials are utilized for photolithographic processes including Litho Etch Litho Etch (LELE) patterning processes, self-aligned double patterning (SADP) and self-aligned quadruple patterning (SAQP). Embodiments of the present invention can be applied in different stages of patterning, such as, for example, back end of line (BEOL), front end of line (FEOL), and middle of line (MOL) applications.

As used herein, a "line" in a patterned design refers to a design intended to make a horizontal connection. By way of non-limiting example, in the BEOL, this may be a pattern for a conductor at a given interconnect level. In the FEOL, this may be a pattern for fins (in FinFET devices) or gates.

Embodiments will now be described in further detail with regard to semiconductor devices comprising metallic interconnect structures, as well as methods for fabricating metallic interconnect structures with a metal cut to form a gap in the line. It is known that the formation of gaps in metallic lines has a high impact on the proper functioning of the semiconductor device. Minimizing gap failure between lines will greatly increase the unit cell density which in turn will lead to a shrinkage in the device dimension. However, due to the line end shortening issues and the resolution limitations of photolithography, currently available lithographic techniques experience issues in forming uniform gaps and breaks in metallic lines particularly in view of advanced BEOL designs.

Figure 1A:
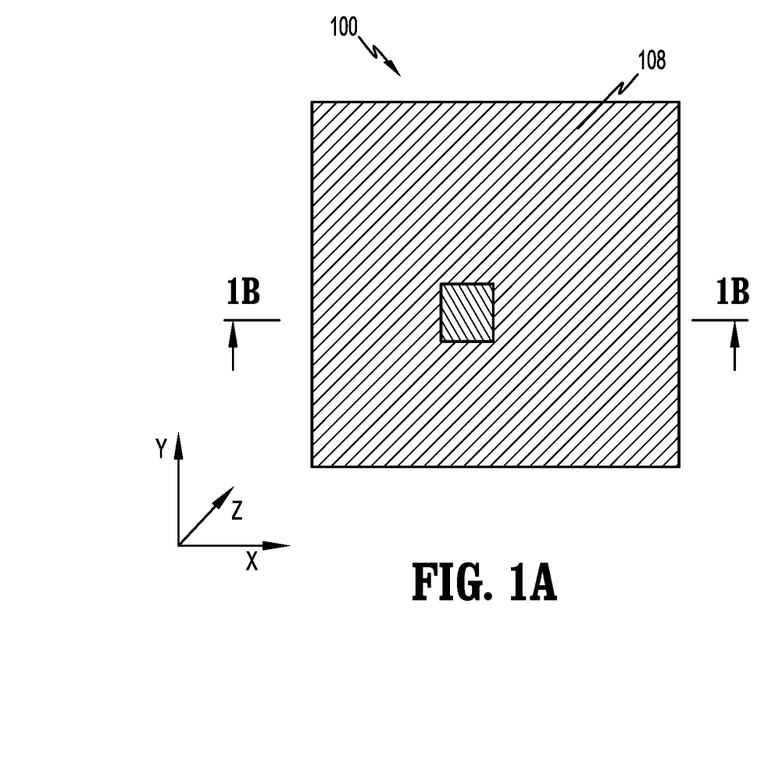
FIG. 1A is a schematic top plan view of a semiconductor structure at a first intermediate stage of fabrication according to one or more illustrative embodiments.
Figure 1B:
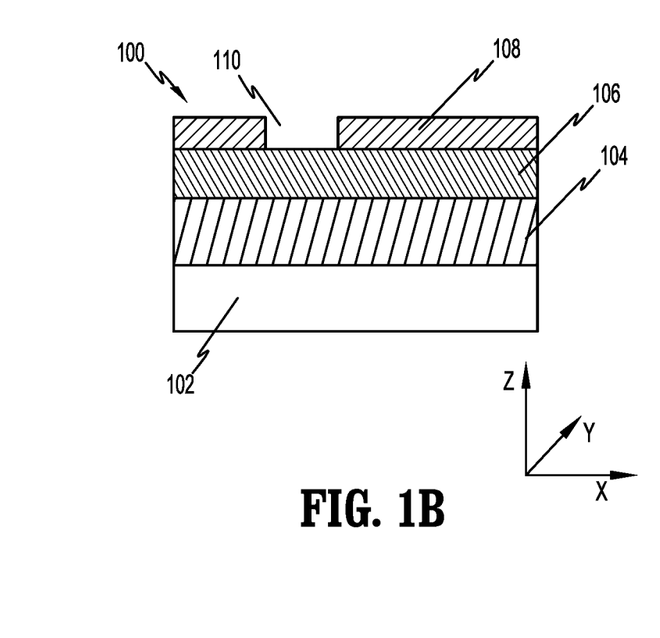
FIG. 1B is a cross-sectional view of the semiconductor structure taken along the lines 1B-1B of FIG. 1A at the first intermediate stage of fabrication according to one or more illustrative embodiments.

Methods for fabricating one or more metallic lines for a metallic interconnect will now be discussed in further detail with reference to FIGS. 1A-7B which schematically depict illustrative embodiments of a semiconductor structure at various stages of fabrication. To begin, FIG. 1A is a top plan view of the semiconductor structure 100 and FIG. 1B is a cross-sectional view taken along the lines 1B-1B of FIG. 1A. FIGS. 1A and 1B illustrate the semiconductor structure 100 at an intermediate stage of fabrication comprising a semiconductor substrate 102 (e.g., semiconductor wafer), which may include a FEOL (front-end-of-line)/MOL (middle-of-line) structure incorporated with or formed on the semiconductor substrate 102, a dielectric layer 104, a hard mask layer 106 disposed or formed on the dielectric layer 104 and a sacrificial material or mandrel layer 108 disposed on the hard mask layer 106.

While the semiconductor substrate 102 is illustrated as a generic substrate layer, it is to be understood that the semiconductor substrate 102 may comprise one of different types of semiconductor substrate structures and materials. For example, in one embodiment, the semiconductor substrate 102 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 102 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL. The semiconductor substrate 102 may include a FEOL/MOL layer or structure comprising various semiconductor structures and components that are formed in or on the active surface of the semiconductor substrate 102 to provide integrated circuitry for a target application. For example, the FEOL structure may comprise field-effect transistor (FET) devices (such as FinFET devices, vertical FET devices, planar FET device, etc.), bipolar transistors, diodes, capacitors, inductors, resistors, isolation devices, etc., which are formed in or on the active surface of the semiconductor substrate 102. In general, FEOL processes typically include preparing the semiconductor substrate 102 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The semiconductor substrate 102 may further comprise a MOL structure or layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts (not shown) that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed on the FEOL/MOL structure.

The dielectric layer 104 may comprise a "low k" insulating/dielectric material such as silicon dioxide (e.g. $SiO_2$), silicon nitride (SiN), silanol (SiOH), hydrogenated silicon nitride (SiNH), silicon carbide (SiC), silicon carbon nitride (SiCN), hydrogenated silicon carbide (SiCH), fluorine-doped silicon oxide (SiOF), carbon doped oxide (CDO), silicon oxycarbide (SiOC) films or organosilicate (SiOCH) low-k films and other similar types of insulating/dielectric materials or porous dielectrics. The dielectric layer 104 may be formed using known deposition techniques, such as, for example, atomic layer deposition (ALD), chemical vapor deposition (CVD), plasma-enhanced CVD (PECVD), or physical vapor deposition (PVD), or spin-on deposition. According to an embodiment, the dielectric layer 104 is an inter-layer dielectric layer that is to be part of a BEOL interconnect structure of an integrated circuit where devices, including, but not limited to, transistors, capacitors, and resistors are interconnected with metallization layers (e.g., wiring) on the semiconductor structure 102.

The hard mask film or layer 106 may include any suitable material, such as, for example, a titanium nitride (TiN) or metal oxides including titanium oxide (TiOx), a silicon-rich anti-reflective coating (SiARC), silicon oxynitride (SiON), silicon dioxide ($SiO_2$), a titanium-rich anti-reflective coating (TiARC), etc. and can have a thickness of about 5 nm to about 50 nm. The hard mask layer 106 may be deposited on the semiconductor substrate 102 using any known techniques including, for example, a plasma enhanced atomic layer deposition (PEALD) process, a plasma-enhanced chemical vapor deposition (PECVD) process or a physical vapor deposition (PVD) process, chemical vapor deposition (CVD), (atomic layer deposition) ALD, etc. The hard mask layer 106 may comprise multiple layers of the same or optionally different material. The hard mask material of the hard mask layer 106 is selected to eventually be etched away any suitable etching process including, for example, a reactive ion etching (ME) (with, e.g., a halogen-based plasma chemistry) or wet etching.

The mandrel layer 108 is deposited on the hard mask layer 106. The material of the mandrel layer 108 may comprise an amorphous silicon or any hard mask material identified hereinabove in connection with the description of the hard mask layer 106, including metals such as titanium nitride (TiN) or other metal oxides. The mandrel layer 108 may be deposited using, for example, any suitable deposition technique known in the art, including, but not limited to, chemical vapor deposition (CVD), plasma enhanced CVD (PECVD), physical vapor deposition (PVD), atomic layer deposition (ALD), molecular beam deposition (MBD), pulsed laser deposition (PLD), and/or liquid source misted chemical deposition (LSMCD). FIGS. 1A and 1B illustrate a cut or opening 110 in the mandrel layer 108. The opening 110 may be formed through one or more conventional lithographic patterning and etching processes. The etching process may include reactive ion etching (utilizing hydrogen chlorine chemistry) or other chemical etching and selectively etches the material of the mandrel layer 108 and no underlaying layers. The opening 110 defines a template which eventually forms an opening or cut in a metallic line during metallization.

Figure 2A:
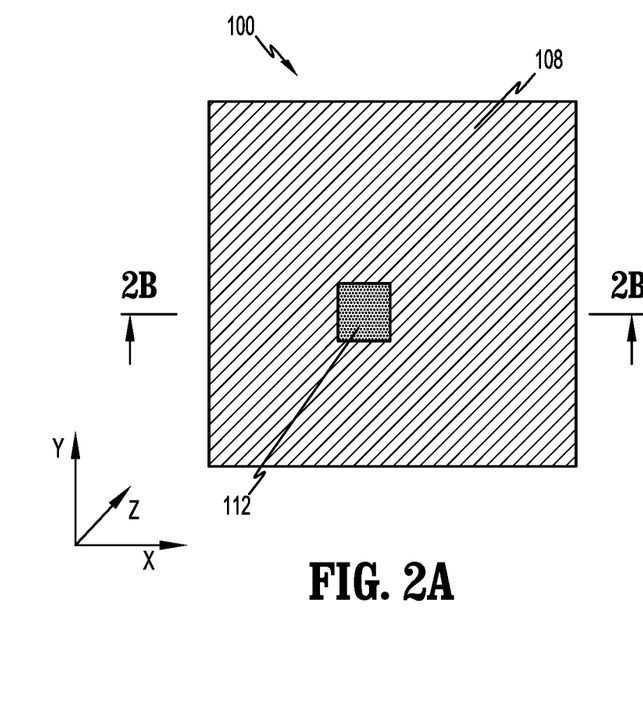
FIG. 2A is a schematic top plan view of the semiconductor structure at a second intermediate stage of fabrication according to one or more illustrative embodiments.
Figure 2B:
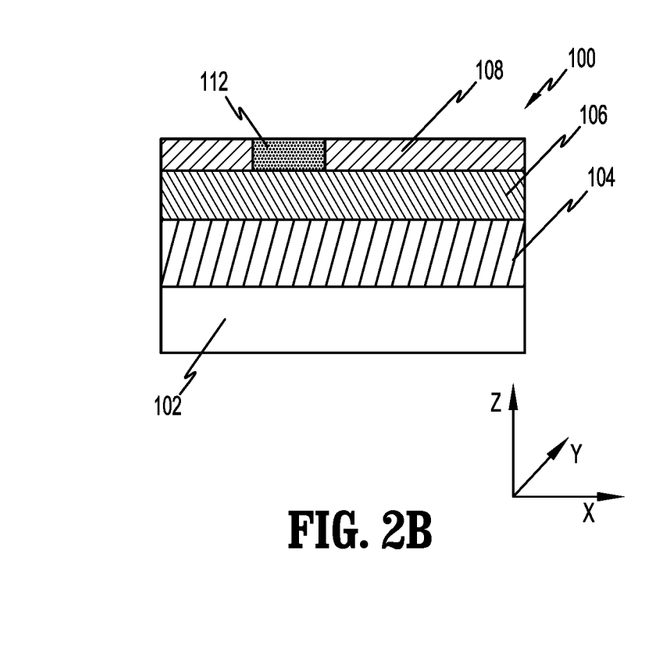
FIG. 2B is a cross-sectional view taken along the lines 2B-2B of FIG. 2A further illustrating the semiconductor structure at the second intermediate stage of fabrication according to one or more illustrative embodiments.

Referring now to FIGS. 2A and 2B, a sacrificial cut fill 112 is deposited in the opening 110 of the mandrel layer. The sacrificial cut fill 112 may include any suitable materials such as oxides (such as silicon dioxide, spin on glass, etc.), nitrides (such as silicon nitride), or the same material as the mandrel material 108. The sacrificial cut fill 112 may be deposited using known deposition techniques. The sacrificial cut fill 112 is subjected to an etching or planarization process to be planar with the top of the mandrel layer 108. Suitable planarization techniques include chemical mechanical polishing (CMP), or other conventional planarization techniques. The sacrificial cut fill 112 prevents pattern transfer to the segment of the hard mask layer 106 vertically beneath the sacrificial cut fill 112.

Figure 3A:
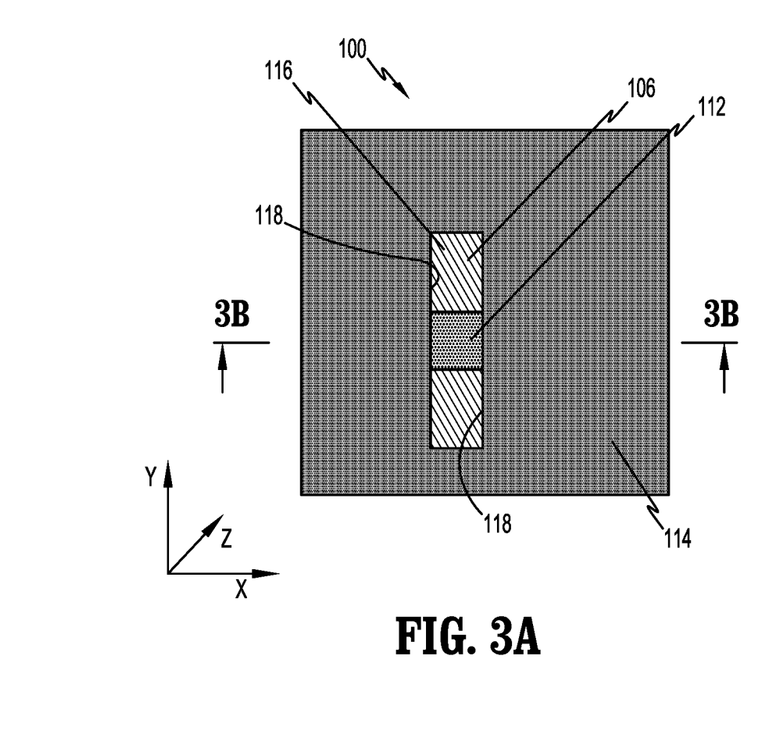
FIG. 3A is a schematic top plan view of the semiconductor structure at a third intermediate stage of fabrication according to one or more illustrative embodiments.
Figure 3B:
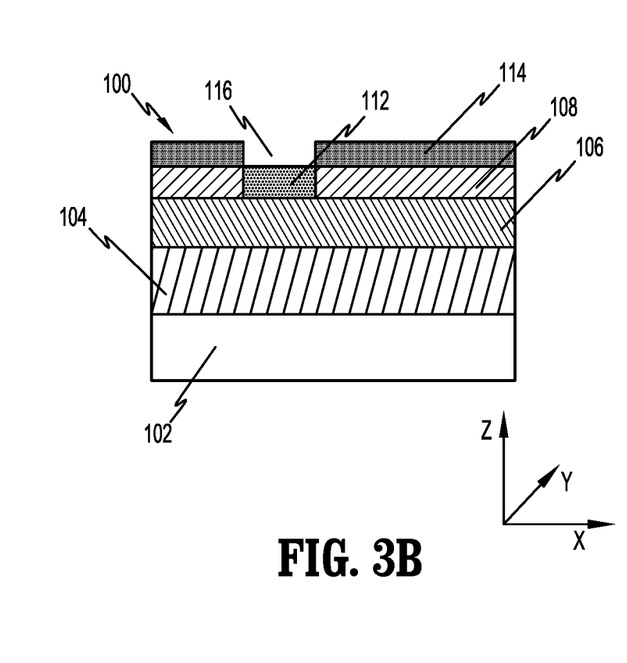
FIG. 3B is a cross-sectional view taken along the lines 3B-3B of FIG. 3A further illustrating the semiconductor structure at the third intermediate stage of fabrication according to one or more illustrative embodiments.

With reference to FIGS. 3A and 3B, a layer of photoresist 114 is deposited over the sacrificial mandrel layer 108 (with an optional antireflective layer) and the photoresist 114 is patterned as desired, for example, by exposing the photoresist layer to radiation (e.g., ultraviolet radiation, electron beam, x-ray, ion beams, etc.) through a lithographic photomask, and then applying an aqueous developer solution to the exposed photoresist layer to pattern the photoresist 114. In one illustrative embodiment, an ARC layer (not shown) may be utilized to reduce reflection of light from a layer to be etched during exposure of a photoresist layer formed over the ARC layer. The ARC layer may comprise an organic or inorganic anti-reflection coating. In one illustrative embodiment, the ARC layer comprises a silicon ARC (Si-ARC) layer. In an illustrative embodiment, the photoresist 114 is formed by depositing (e.g., spin coating) a layer of photoresist material over the ARC layer, and then exposing and developing the layer of photoresist material to form the photoresist pattern having resist images or openings. In some embodiments, the thickness of the photoresist layer 114 is in a range of about 20 nm to about 800 nm, although lesser and greater thicknesses can also be employed. The photoresist 114 is patterned to define an opening encompassing the area above the sacrificial cut fill 112. The photoresist layer 114 can be a layer of a positive photoresist material that is sensitive to deep-ultraviolet (DUV) radiation, extreme ultraviolet (EUV), or mid-ultraviolet (MUV) radiation as known in the art, or the photoresist layer can be an e-beam resist material that is sensitive to radiation of energized electrons. Negative photoresist material is also contemplated.

In illustrative embodiments, the photoresist 114 is patterned to define an opening or resist image 116 in the area above the sacrificial cut fill 112 and on each side of the sacrificial cut fill 112. The resist image 116 is elongated and will define the shape of the metal line of the metallic interconnect.

After the photoresist 114 is developed and patterned, using the photoresist 114 as an etch mask, portions of the mandrel layer 108 beneath the resist image 116 of the photoresist 114 are removed such that recesses 118 are formed in the mandrel layer 108. The recesses 118 may extend to the hard mask layer 106 as shown in FIG. 3A or terminate within the hard mask layer 106. In one methodology, a conventional etching process, e.g., reactive ion etching (RIE) (with, e.g., a halogen-based plasma chemistry) selectively etches the material of the mandrel layer 108 with respect to the material of the sacrificial cut fill 112 to remove the portions of the mandrel layer 108 on each side a the sacrificial cut fill 112 while maintaining the sacrificial cut fill 112 intact.

Figure 4A:
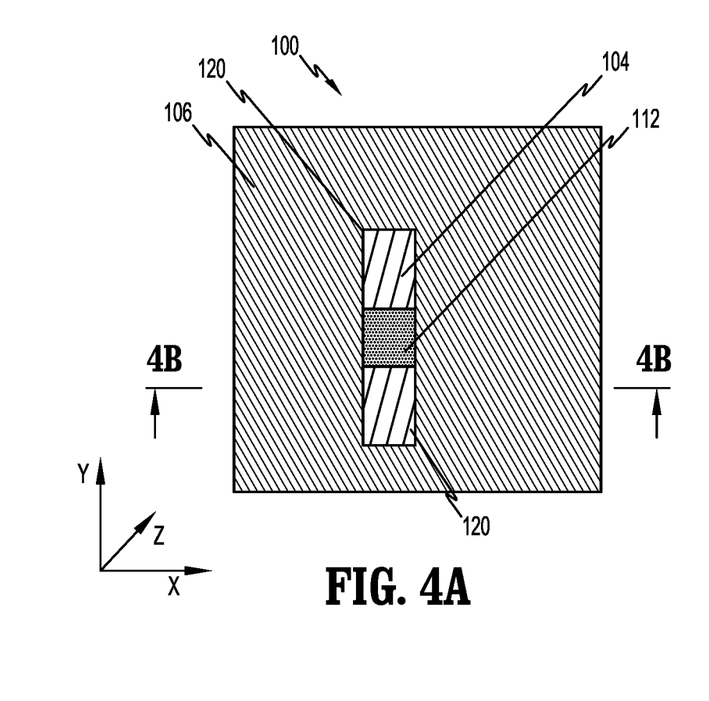
FIG. 4A is a schematic top plan view of the semiconductor structure at a fourth intermediate stage of fabrication according to one or more illustrative embodiments.
Figure 4B:
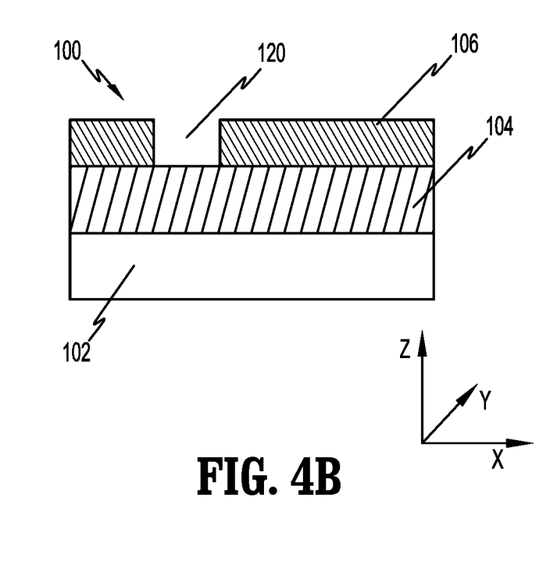
FIG. 4B is a cross-sectional view taken along the lines 4B-B of FIG. 4A further illustrating the semiconductor structure at the fourth intermediate stage of fabrication according to one or more illustrative embodiments.

Referring now to FIGS. 4A and 4B, the pattern is transferred into the hard mask layer 106. The exposed material of the hard mask layer 106 is subjected to an etching process selective to the sacrificial cut fill 112 and the underlying dielectric layer 104 substrate to remove portions of the hard mask layer 106 in accordance with the transferred pattern. The etching process utilized includes hydrogen chlorine reactive ion etching or other chemical etching, and requires a change in chemical etch solutions from the previous etching process. Alternatively, depending on the materials of the mandrel layer 108 and the material of the hard mask layer 106, a single etching process may be utilized to etch away the desired segments of the mandrel layer 108 and the hard mask layer 106. Subsequent to the etching process, openings 120 corresponding to the photoresist pattern, i.e., resist image 116, of the photoresist 114 and the recesses 118 of the mandrel layer 108 are formed in the hard mask layer 106 with the exception of the segment of the hard mask layer 106 beneath the sacrificial cut fill 112. The cross-section of FIG. 4B is taken through one the opening 120 in the hard mask layer 106. A similar opening 120 is disposed on the other side of the sacrificial cut fill 112.

Figure 5A:
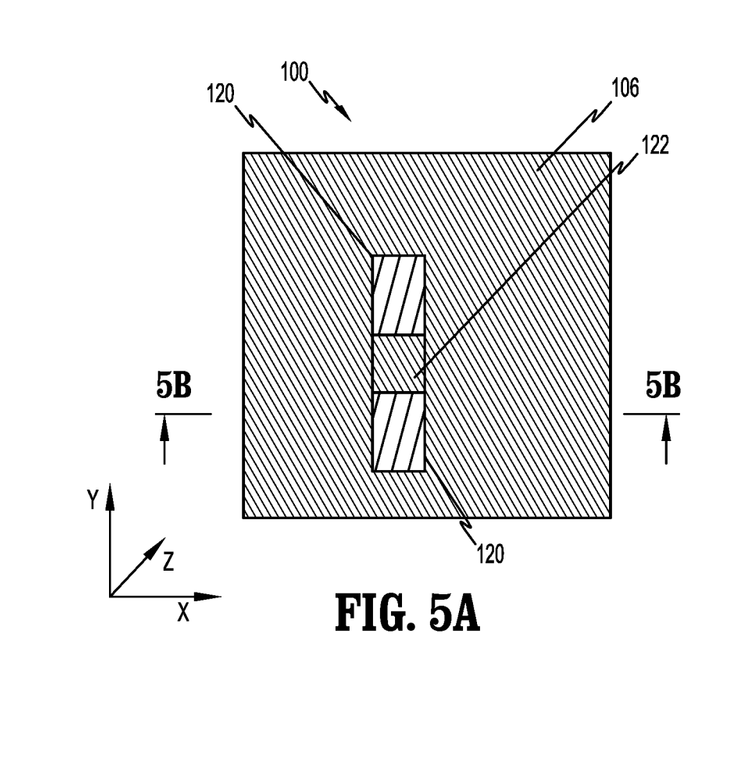
FIG. 5A is a schematic top plan view of the semiconductor structure at a fifth intermediate stage of fabrication according to one or more illustrative embodiments.
Figure 5B:
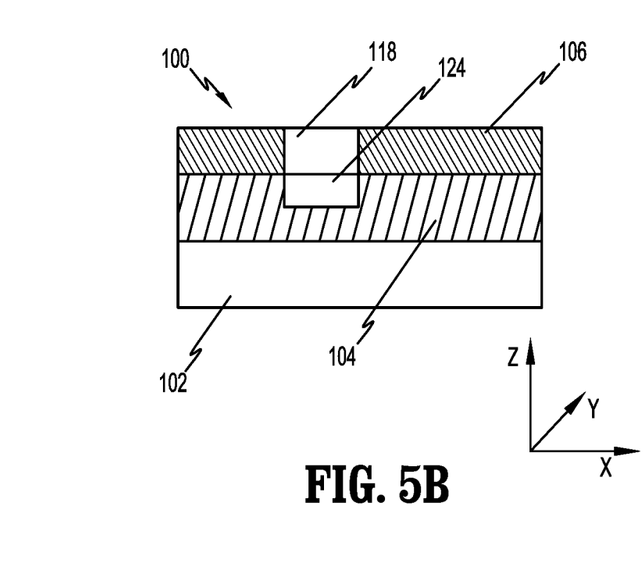
FIG. 5B is a cross-sectional view taken along the lines 5B-5B of FIG. 5A further illustrating the semiconductor structure at the fifth intermediate stage of fabrication according to one or more illustrative embodiments.

With reference now to FIGS. 5A and 5B, any residual material remaining from the photoresist 114, the mandrel layer 108 and the sacrificial cut fill 112 is removed leaving the hard mask layer 106 on the dielectric layer 104. As shown in FIG. 5A, the patterned hard mask layer 106 includes the two aligned openings 120 separated by a hard mask segment 122 (initially beneath the sacrificial cut fill 112) and preserved during the earlier etching processes. Using the patterned hard mask layer 106 as a template, the segments of the dielectric layer 104 beneath or aligned with the patterned openings 120 of the hard mask layer 106 are selectively etched to remove the exposed material of the dielectric layer 104 to thereby form opposed aligned trenches 124 in the dielectric layer 104 via any standard oxide etching process including, for example, fluorine etching, etc. The dielectric material of the dielectric layer 104 beneath the hard mask segment 122 is not subjected to the etch process. The trenches 124 may go only partially through the dielectric layer 104 or completely through the dielectric layer 104.

Figure 6A:
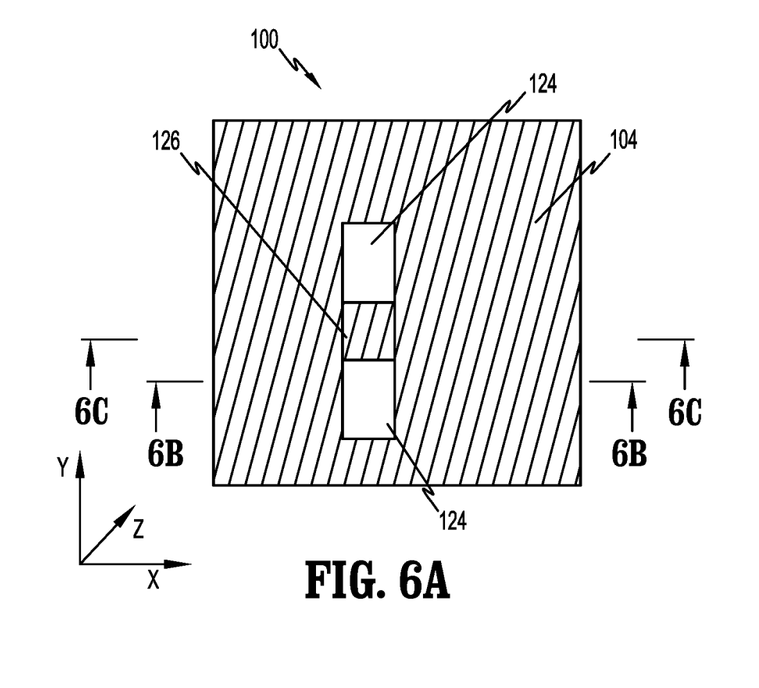
FIG. 6A is a schematic top plan view of the semiconductor structure at a sixth intermediate stage of fabrication according to one or more illustrative embodiments.
Figure 6B:
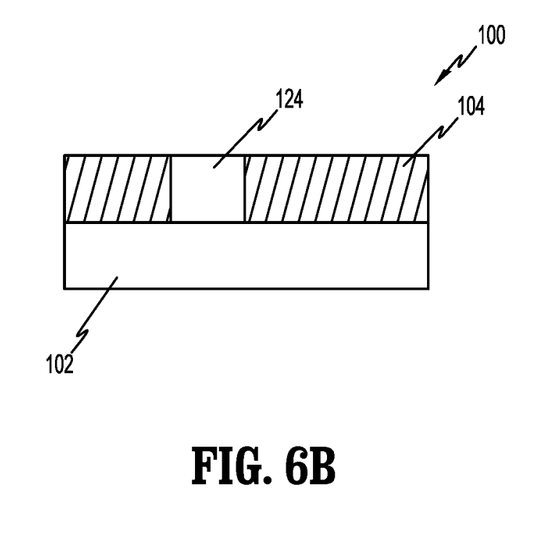
FIG. 6B is a cross-sectional view taken along the lines 6B-6B of FIG. 6A further illustrating the semiconductor structure at the sixth intermediate stage of fabrication according to one or more illustrative embodiments.
Figure 6C:
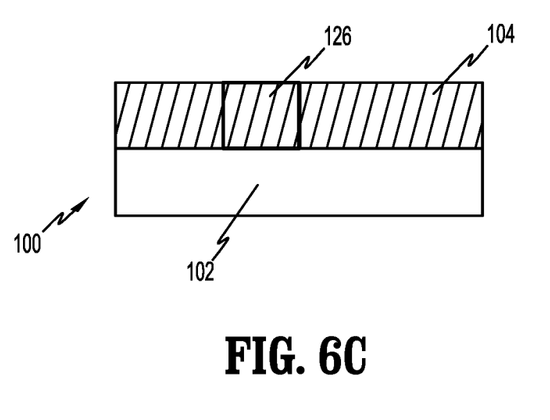
FIG. 6C is a cross-sectional view taken along the lines 6C-6C of FIG. 6A further illustrating the semiconductor structure at the sixth intermediate stage of fabrication according to one or more illustrative embodiments.

Referring now to FIGS. 6A-6C, the hard mask layer 106, via a conventional etching process, e.g., reactive ion etching (RIE) (with, e.g., a halogen-based plasma chemistry) is removed leaving the dielectric layer 104 on the semiconductor substrate 102. FIG. 6B is a cross-sectional view taken along the lines 6B-6B of FIG. 6A and through one of the trenches 124 formed in the dielectric layer 104. Another trench 124 is on the opposite side of the segment 126 of the dielectric layer 104. FIG. 6C is a cross-sectional view taken along the lines 6C-6C of FIG. 6A and through the remaining segment 126 of the dielectric layer 104, i.e., the remaining segment 126 which was beneath the hard mask segment 122 of the hard mask layer 106. As shown, this segment 126 is not subjected to any etching process due to the use of the sacrificial cut fill 112 (i.e., it was vertically aligned beneath the sacrificial cut fill 112 and the hard mask segment 122). Thus, trenches 124 are formed in the dielectric layer 104 with a cut line or break via the remaining hard mask segment 122 to separate the trenches 124.

Figure 7A:
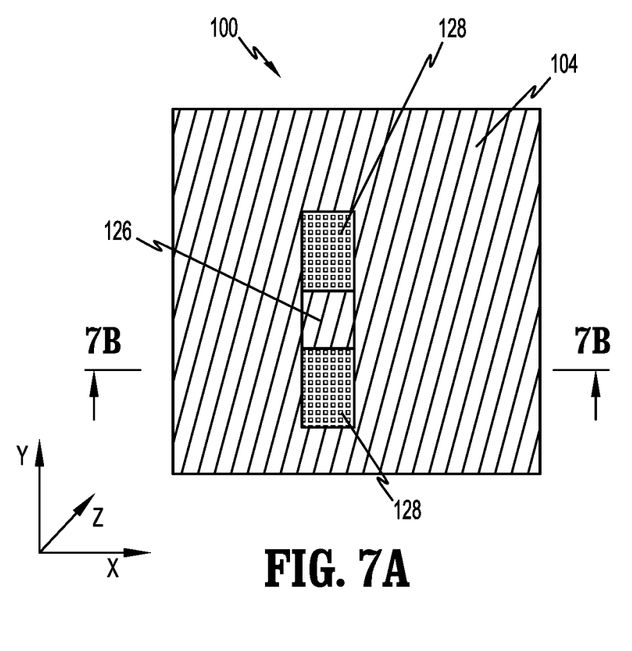
FIG. 7A is a schematic top plan view of the semiconductor structure at a seventh intermediate stage of fabrication according to one or more illustrative embodiments.
Figure 7B:
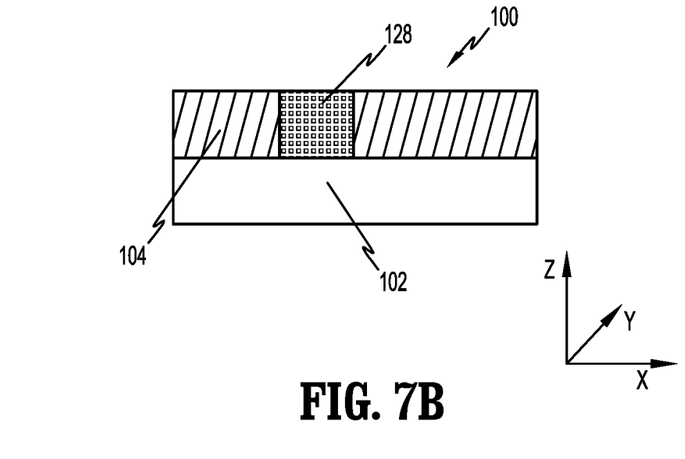
FIG. 7B is a cross-sectional view taken along the lines 7B-7B of FIG. 7A further illustrating the semiconductor structure at the seventh intermediate stage of fabrication according to one or more illustrative embodiments.

Referring now to FIGS. 7A and 7B, a next phase of the process flow comprises depositing a layer of metallic material to form metallic lines 128 within the trench openings 124 to form the metallic interconnect structures (e.g., metallic lines). As best depicted in FIG. 7A, the metallic lines 128 are separated by the remaining segment 126 of the dielectric layer 104. In illustrative embodiments, the metallic lines 128 comprise copper (Cu). In other embodiments, the metallic material can be, for example, aluminum (Al), tungsten (W), iridium (Ir), cobalt (Co), ruthenium (Ru), or alloys thereof. It is also noted that a thin metal liner or combination of multiple metal liners, such as titanium nitride (TiN), tantalum nitride (TaN), ruthenium (Ru), etc. can be deposited first as a barrier or an adhesion layer followed by bulk metal deposition. The metallic material is deposited using known dry deposition techniques such as ALD, PVD or CVD or wet deposition techniques such as electroplating, and electroless plating, etc. The planarization process can be implemented using a chemical-mechanical polish (CMP) process with a suitable etch slurry.

FIGS. 7A and 7B depict a semiconductor structure formed by the process of the present disclosure. The semiconductor structure 100 includes a semiconductor substrate 102, a dielectric layer 104 and one or more metallic lines as components of an interconnect structure, for example, in a BEOL architecture.

Thus, the fabrication process of the present disclosure facilitates the formation of metallic lines with breaks to be incorporated, for example, as a component of a BEOL interconnect structure. It is appreciated the aforedescribed process may be repeated several times to produce various metallic lines within the dielectric layer 104 to address the circuit architecture. Several metallic lines may be formed simultaneously during one sequence of the process. Moreover, the process described herein produces metallic lines with uniform breaks thereby addresses the deficiencies of conventional technologies, particularly, those technologies utilizing pillar processes or the like.

It is envisioned that the semiconductor structure may be a part of a semiconductor and also a component of an integrated circuit. The resulting integrated circuit incorporating the semiconductor components can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuits, ranging from toys and other low-end applications to advanced computer products having a display, a keyboard or other input device, and a central processor.

It is to be understood that the embodiments discussed herein are not limited to the particular materials, features, and processing steps shown and described herein. In particular, with respect to the processing steps, it is to be emphasized that the descriptions provided herein are not intended to encompass all of the processing steps that may be required to form a functional semiconductor integrated circuit device.

The descriptions of the various illustrative embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming a dielectric layer on a semiconductor substrate;
    forming a hard mask layer on the dielectric layer;
    forming a mandrel layer on the hard mask layer;
    creating an opening in the mandrel layer;
    depositing a sacrificial cut material within the opening of the mandrel layer;
    applying a photoresist material onto the mandrel layer;
    patterning the photoresist material to create a resist image having at least two resist openings separated by the sacrificial cut material;
    selectively etching segments of the mandrel layer and the hard mask layer beneath the resist openings of the photoresist to remove the segments and transfer the resist image to the hard mask layer;

removing the mandrel layer and the sacrificial cut material;

etching the dielectric layer utilizing the transferred resist image to create at least first and second trenches within the dielectric layer separated by a segment of the dielectric layer vertically aligned with a location of the previously removed sacrificial cut material; and depositing a metallic material within the trench openings to define at least first and second lines in the trench openings separated by the segment of the dielectric layer.

2. The method of claim 1 wherein creating the opening in the mandrel layer is performed before selectively etching segments of the mandrel layer and the hard mask layer.

3. The method of claim 2 wherein creating the opening comprises a chemical etching process.

4. The method of claim 3 including removing the hard mask prior to depositing the metallic material.

5. The method of claim 1 wherein depositing the sacrificial cut material includes depositing a material comprising at least one of nitride and an oxide.

6. The method of claim 1 wherein selectively etching segments of the mandrel layer and the hard mask layer includes at least two etching processes, a first etching process utilized to remove segments of the mandrel layer and a second etching process utilized to remove segments of the hard mask material.

7. The method of claim 1 wherein the dielectric layer comprises a dielectric material selected from the group consisting of silicon oxide, silicon nitride, silanol, hydrogenated silicon nitride, silicon carbide, silicon carbon nitride or hydrogenated silicon carbide.

8. The method of claim 1 wherein depositing the sacrificial cut material includes planarizing the cut material.

9. The method of claim 8 wherein the sacrificial cut material comprises at least one of a nitride and an oxide.

10. The method of claim 1 wherein the mandrel layer comprises at least one of one of amorphous silicon, titanium oxide, silicon nitride and amorphous germanium.

11. The method of claim 1 wherein the hard mask layer comprises at least one of silicon nitride, titanium nitride and titanium oxide.

12. A method, comprising:

forming a dielectric layer on a semiconductor substrate;

forming a hard mask layer on the dielectric layer;

forming a sacrificial mandrel layer on the hard mask layer;

creating a line cut in the sacrificial mandrel layer by forming an opening in the mandrel layer and filling the opening with sacrificial cut material;

forming first and second open lines within the mandrel layer on opposed sides of the sacrificial cut material forming the line cut;

removing segments of the hard mask layer and the dielectric layer vertically aligned with the first and second cuts to thereby form first and second trenches in the dielectric layer vertically aligned with the first and second open lines and separated by an aligned segment of the dielectric layer beneath a location of the sacrificial cut material; and depositing a metallic material within the first and second trenches to define at least first and second lines in the trenches separated by the aligned segment of the dielectric material.

13. The method of claim 12 wherein removing segments of the hard mask layer and the dielectric layer includes one or more photolithographic and etching processes.

14. The method of claim 12 wherein the sacrificial cut material comprises at least one of a nitride and an oxide.

15. The method of claim 12 wherein the mandrel layer comprises one of an amorphous silicon, titanium oxide, silicon nitride and an amorphous germanium.

16. A method, comprising:

forming a dielectric layer on a semiconductor substrate;

forming a hard mask layer on the dielectric layer;

forming a sacrificial mandrel layer on the hard mask layer;

depositing a sacrificial fill material in an opening in the sacrificial mandrel layer;

utilizing the sacrificial fill material to selectively pattern the hard mask layer, the pattern forming first and second spaced openings in the hard mask layer; and etching the dielectric layer through the first and second openings in the hard mask layer to create first and second trenches in the dielectric layer separated by a dielectric segment of the dielectric layer.

17. The method of claim 16 wherein the dielectric segment of the dielectric layer is in vertical alignment with a hard mask segment of the hard mask layer, the hard mask segment separating the first and second openings.

18. The method of claim 17 wherein utilizing the sacrificial fill material includes isolating the hard mask segment of the hard mask layer from one or more etching process with the sacrificial fill material.

19. The method of claim 18 including depositing a metallic material within the first and second trenches in the dielectric layer to create first and second lines separated by a dielectric segment of the dielectric layer.

20. The method of claim 19 including removing the mandrel layer and the sacrificial fill material prior to etching the dielectric layer.

* * * * *